(12) United States Patent
Lin (10) Patent No.: US 10,128,348 B2
(45) Date of Patent: *Nov. 13, 2018

(54) METAL BUMP STRUCTURE FOR USE IN DRIVER IC AND METHOD FOR FORMING THE SAME

(71) Applicant: HIMAX TECHNOLOGIES LIMITED, Tainan (TW)

(72) Inventor: Chiu-Shun Lin, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/269,209

(22) Filed: May 5, 2014

(65) Prior Publication Data
US 2014/0327133 A1  Nov. 6, 2014

Related U.S. Application Data

(60) Provisional application No. 61/820,152, filed on May 6, 2013.

(51) Int. Cl.
*H01L 23/48* (2006.01)
*H01L 23/52* (2006.01)
(Continued)

(52) U.S. Cl.
CPC .............. *H01L 29/43* (2013.01); *H01L 24/11* (2013.01); *H01L 24/13* (2013.01); *H01L 24/03* (2013.01); *H01L 24/05* (2013.01); *H01L 2224/0345* (2013.01); *H01L 2224/0361* (2013.01); *H01L 2224/03614* (2013.01); *H01L 2224/03912* (2013.01); *H01L 2224/0401* (2013.01); *H01L 2224/05009* (2013.01); *H01L 2224/05022* (2013.01); *H01L 2224/05027* (2013.01); *H01L 2224/05124* (2013.01);
(Continued)

(58) Field of Classification Search
CPC ..... H01L 24/13; H01L 24/0105; H01L 24/11; H01L 2224/11; H01L 2225/1058; H01L 24/81; H01L 2224/13009; H01L 2224/13024; H01L 24/10
USPC .......................... 257/780, 781; 438/613, 614
See application file for complete search history.

(56) References Cited

U.S. PATENT DOCUMENTS 4,205,099 A * 5/1980 Jones .................. H01L 21/2885
                                                                      205/123
5,508,228 A * 4/1996 Nolan ................... H01L 21/563
                                                                      257/E21.503
(Continued)

FOREIGN PATENT DOCUMENTS

JP        2007103953 A     4/2007
KR    1020040081732 A      9/2004
(Continued)

*Primary Examiner* — S. V. Clark
(74) *Attorney, Agent, or Firm* — Winston Hsu (57) ABSTRACT

A metal bump structure for use in a driver IC includes a metal bump disposed on a matrix, an optional capping layer disposed on the metal bump to completely cover the metal bump and a protective layer disposed on the metal bump to completely cover and protect the metal bump or the optional capping layer and so that the metal bump is not exposed to an ambient atmosphere. The protective layer or the optional capping layer may have a fringe disposed on the matrix.

25 Claims, 5 Drawing Sheets

(51) Int. Cl.
*H01L 29/40* (2006.01)
*H01L 29/43* (2006.01)
*H01L 23/00* (2006.01)

(52) U.S. Cl.
CPC .............. *H01L 2224/05166* (2013.01); *H01L 2224/05572* (2013.01); *H01L 2224/05582* (2013.01); *H01L 2224/05647* (2013.01); *H01L 2224/1134* (2013.01); *H01L 2224/1146* (2013.01); *H01L 2224/1147* (2013.01); *H01L 2224/1181* (2013.01); *H01L 2224/1182* (2013.01); *H01L 2224/11825* (2013.01); *H01L 2224/11848* (2013.01); *H01L 2224/13006* (2013.01); *H01L 2224/1357* (2013.01); *H01L 2224/13139* (2013.01); *H01L 2224/13144* (2013.01); *H01L 2224/13147* (2013.01); *H01L 2224/13164* (2013.01); *H01L 2224/13552* (2013.01); *H01L 2224/13562* (2013.01); *H01L 2224/13582* (2013.01); *H01L 2224/13611* (2013.01); *H01L 2224/13644* (2013.01); *H01L 2224/13655* (2013.01); *H01L 2224/13664* (2013.01); *H01L 2924/0105* (2013.01); *H01L 2924/01028* (2013.01); *H01L 2924/15788* (2013.01)

(56) References Cited

U.S. PATENT DOCUMENTS

| | | | | |
|---|---|---|---|---|
| 5,707,902 A * | 1/1998 | Chang | | H01L 24/11 257/E21.508 |
| 7,601,566 B2 * | 10/2009 | Sakakura | | H01L 27/1214 257/59 |
| 7,608,929 B2 * | 10/2009 | Hu | | C23C 26/00 257/779 |
| 7,612,456 B2 | 11/2009 | Fujii | | |
| 7,713,861 B2 * | 5/2010 | Yu | | H01L 24/03 257/673 |
| 7,786,581 B2 * | 8/2010 | Kang | | H01L 24/11 257/737 |
| 8,299,629 B2 * | 10/2012 | Chu | | H01L 24/03 257/778 |
| 8,501,614 B1 * | 8/2013 | Shih | | H01L 23/49811 257/737 |
| 2004/0166661 A1 | 8/2004 | Lei | | |
| 2006/0055037 A1 | 3/2006 | Park | | |
| 2007/0075422 A1 | 4/2007 | Fujii | | |
| 2007/0080453 A1 | 4/2007 | Jang | | |
| 2007/0267745 A1 | 11/2007 | Chao | | |
| 2008/0050905 A1 * | 2/2008 | Uchida | | H01L 24/03 438/614 |
| 2010/0109159 A1 * | 5/2010 | Ho | | H01L 24/11 257/737 |
| 2012/0139113 A1 * | 6/2012 | Arvin | | H01L 24/11 257/751 |
| 2013/0026614 A1 * | 1/2013 | Yu | | H01L 24/13 257/673 |
| 2013/0043585 A1 | 2/2013 | Wakiyama et al. | | |
| 2013/0193570 A1 * | 8/2013 | Kuo | | H01L 24/11 257/737 |
| 2015/0162305 A1 * | 6/2015 | Moyers | | H01L 24/94 257/737 |

FOREIGN PATENT DOCUMENTS

| | | |
|---|---|---|
| KR | 1020050060032 A | 6/2005 |
| KR | 1020060024928 A | 3/2006 |
| KR | 1020070042492 A | 4/2007 |
| KR | 100850212 B1 | 8/2008 |
| KR | 1020080102545 A | 11/2008 |
| KR | 1020110090332 A | 8/2011 |
| KR | 101140481 B1 | 4/2012 |
| TW | 200511541 | 3/2005 |
| TW | 200744142 | 12/2007 |
| TW | 201044526 | 12/2010 |
| TW | 201044527 | 12/2010 |

* cited by examiner

METAL BUMP STRUCTURE FOR USE IN DRIVER IC AND METHOD FOR FORMING THE SAME

CROSS REFERENCE TO RELATED APPLICATIONS

This application claims the benefit of U.S. Provisional Application Ser. No. 61/820,152, filed May 6, 2013.

BACKGROUND OF THE INVENTION

1. Field of the Invention

The present invention generally relates to a metal bump structure and a method for forming the same. In particular, the present invention is directed to a metal bump structure for use in a driver IC to be protected from an ambient atmosphere, free of a galvanic effect in the presence of high electric field or halogen as well as a method for forming the same.

2. Description of the Prior Art

In some electronic circuits, metal bumps are used to form connections between two groups of circuits. In order to lower the inevitable contact resistance and to achieve the best possible results, copper is often used as the first choice of the metal bump material.

Generally speaking, copper is an ideal metal to serve as a metal bump material because it is not chemically active and has extremely low electric resistance. However, in some application cases, copper which serves as a metal bump material suffers serious damages due to an undesirable phenomenon, namely galvanic effect, in the presence of extreme or abnormal conditions. This is adverse to the electronic circuits.

Further, metal bumps made of other metals, such as gold, are extremely difficult to re-work once the metal bumps are flawed because aqua regia for re-working is a very corrosive chemical agent. When the electronic circuits with the flawed metal bumps are re-worked anyway, the reliability of the electronic circuits is possibly seriously compromised.

SUMMARY OF THE INVENTION

In the light of the above, the present invention first proposes a metal bump structure for use in an anisotropic conductive film (ACF) bonding or in a driver IC (integrated circuit). This metal bump structure is basically indifferent to the galvanic effect in the presence of extreme or abnormal conditions under the protection of an extremely thin protective layer. Further, this copper bump structure is easy to rework without damaging the reliability of the electronic circuits. In particular, a lateral fringe is formed during a plating process.

The metal bump structure for use in a driver IC includes a matrix, a metal bump, a cover layer such as an optional capping layer and an optional protective layer. The matrix includes a substrate, a metal pad, a passivation layer and an adhesion layer. The passivation layer is disposed on the metal pad and defines a recess disposed on the metal pad. The adhesion layer is completely disposed in the recess, disposed on the metal pad and partially disposed on the passivation layer so that the adhesion layer is in direct contact with the metal pad and with the passivation layer. The metal bump fills the recess and covers the adhesion layer. The cover layer completely covers the metal bump so that the metal bump is not exposed to an ambient atmosphere. In particular, the cover layer has a fringe which extends in a lateral direction and the fringe is disposed on the passivation layer. The protective layer consists of a layer of gold as thin as possible and is capable of keeping the metal bump away from being exposed to an ambient atmosphere.

In one embodiment of the present invention, a notch is disposed among the metal bump, the adhesion layer as well as the passivation layer.

In another embodiment of the present invention, the cover layer is at least one of a capping layer and a protective layer. The capping layer has a capping fringe and the protective layer has a protective fringe. The capping fringe or the protective fringe extends laterally on the matrix. The capping fringe is disposed on the matrix, preferably in direct contact with the passivation layer. The protective fringe is disposed on the metal bump or on the capping layer, preferably in direct contact with the capping fringe or with the passivation layer.

In another embodiment of the present invention, the protective layer fills the notch to form a T-shaped cross section so that the protective fringe is in direct contact with the adhesion layer.

In another embodiment of the present invention, the protective layer consists of a layer of Au.

In another embodiment of the present invention, the capping layer fills the notch to form a T-shaped cross section so that the capping fringe is in direct contact with the adhesion layer.

In another embodiment of the present invention, the capping layer consists of a layer of Pd.

In another embodiment of the present invention, the capping layer is sandwiched between the protective layer and the metal bump so that the protective fringe covers the capping fringe.

In another embodiment of the present invention, an interface of the capping layer and the metal bump is free of an alloy.

In another embodiment of the present invention, the metal bump is self-aligned to the adhesion layer.

In another embodiment of the present invention, the metal bump comprises one of Cu and Au.

In another embodiment of the present invention, the cover layer is self-aligned to the metal bump.

In another embodiment of the present invention, the metal bump structure is free of a galvanic effect in the presence of a high electric field or halogen.

In another embodiment of the present invention, the metal bump structure is used in a chip on glass (COG) package or in a chip on flex (COF) package.

The present invention further proposes a method for forming a metal bump structure for use in a driver IC. First, a matrix and a patterned photoresist on the matrix are provided. The matrix includes a substrate, a metal pad, a passivation layer and an adhesion layer. The passivation layer is disposed on the metal pad and defines a recess disposed on the metal pad. The adhesion layer is disposed in the recess, covers and directly contacts the metal pad and the passivation layer. The patterned photoresist is disposed on the adhesion layer and includes an opening exposing the adhesion layer which is disposed in the recess and on the passivation layer. Second, the opening is filled with a metal bump material, preferably consisting of copper. Then, the patterned photoresist is removed so that the metal bump material becomes a metal bump disposed on the adhesion layer. Next, the adhesion layer which is not covered by the metal bump is removed to partially expose the underlying passivation layer.

Later, an optional thermal curing step is carried out to adjust the hardness of the metal bump. Later, an optional wet-cleaning step is carried out to clean the surface of the metal bump, preferably to remove an oxide on the metal bump layer. Later, an optional wet-cleaning step is carried out to clean the surface of the metal bump, preferably to remove an oxide on the metal bump layer. Later, an optional activating step is carried out to activate the surface of the metal bump. Later, a plating step is carried out to form a cover layer to completely cover the metal bump to protect the metal bump from the galvanic effect. In particular, forming the cover layer collaterally forms a fringe which extends in a lateral direction and the fringe is disposed on the passivation layer.

In one embodiment of the present invention, the adhesion layer is over-removed to form a notch disposed among the metal bump, the adhesion layer and the passivation layer when removing the adhesion layer.

In another embodiment of the present invention, the cover layer is at least one of a protective layer and a capping layer and the fringe is at least one of a protective fringe and a capping fringe which correspond to the protective layer and the capping layer.

In another embodiment of the present invention, the protective layer fills the notch to form a T-shaped cross section so that the protective fringe is in direct contact with the adhesion layer.

In another embodiment of the present invention, the protective layer consists of a layer of Au.

In another embodiment of the present invention, the capping layer fills the notch to form a T-shaped cross section so that the capping fringe is in direct contact with the adhesion layer.

In another embodiment of the present invention, the capping layer consists of a layer of Pd.

In another embodiment of the present invention, the capping layer is sandwiched between the protective layer and the metal bump so that the protective fringe covers the capping fringe.

In another embodiment of the present invention, the metal bump includes one of Cu and Au.

In another embodiment of the present invention, the capping layer is self-aligned to the metal bump.

In another embodiment of the present invention, the optional thermal curing step is carried out under 250° C.-300° C. for about 30 min to lower the hardness of the metal bump.

In another embodiment of the present invention, the hardness of the metal bump after the optional thermal curing step may be smaller than 110 HV (Vickers harness).

In another embodiment of the present invention, the capping layer is formed to completely cover the metal bump without forming an alloy.

In another embodiment of the present invention, the metal bump is free of a galvanic effect in the presence of high electric field or halogen.

In another embodiment of the present invention, plating is used to fill the opening with the metal bump material.

In another embodiment of the present invention, an activating step is carried out to activate the surface of the metal bump to facilitate the formation and adhesion of the cover layer in the presence of a sulfate.

In another embodiment of the present invention, an optional step is carried out before the plating step to rinse the activated metal bump.

In another embodiment of the present invention, the plating step is carried out in the presence of a sulfate.

In another embodiment of the present invention, the plating step is carried out under a pH value lower than 4.

In another embodiment of the present invention, the plating step is carried out to control the growing rate of the capping layer around 0.05 µm/min so that the resultant thickness of the capping layer is around 0.4 µm-0.05 µm.

In another embodiment of the present invention, the electroless step is carried out to control the growing rate of the protective layer around 0.006 µm/min so that the resultant thickness of the protective layer is as small as possible.

In another embodiment of the present invention, an optional step is carried out before the electroless step to rinse the capping layer or the metal bump.

These and other objectives of the present invention will no doubt become obvious to those of ordinary skill in the art after reading the following detailed description of the preferred embodiment that is illustrated in the various figures and drawings.

DETAILED DESCRIPTION

The present invention first provides a method for forming a metal bump structure for use in a driver IC, in a chip on glass (COG) package or in a chip on flex (COF) package. FIG. 1 to FIG. 6 illustrate a possible method to form the desirable metal bump structure. The metal bump structure may be formed by using a patterned photoresist. The patterned photoresist may be formed as follows. First, please refer to FIG. 1, a substrate 10 is provided. The substrate 10 includes an insulating layer 9, a metal pad 11, a passivation layer 12 and an adhesion layer 13.

Figure 1:
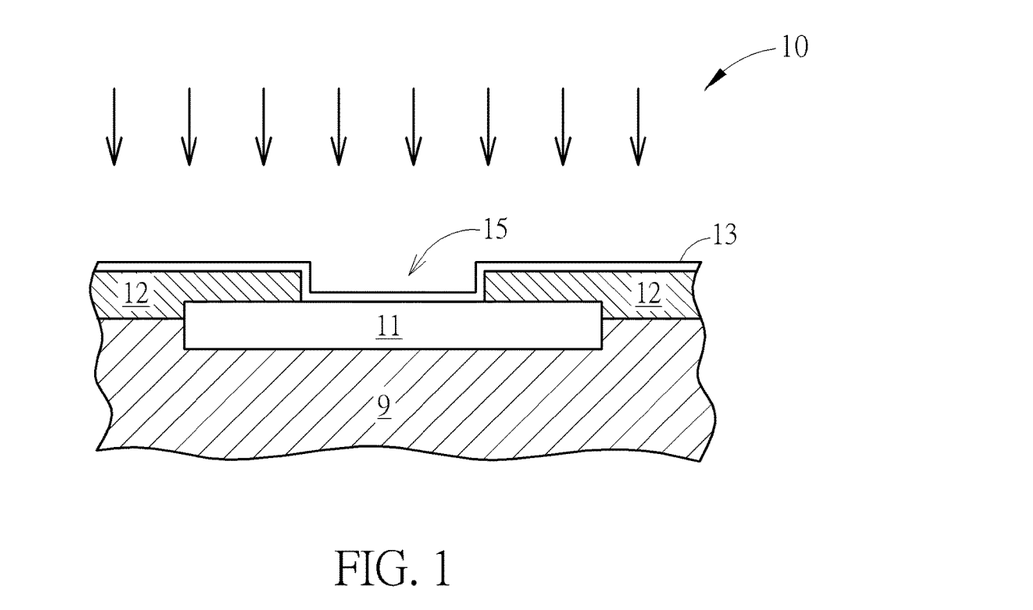
FIG. 1 to FIG. 6 illustrates procedures to form a metal bump structure of the present invention.

The insulating layer 9 is the basis of the substrate 10 to support other elements, such as the metal pad 11, the passivation layer 12, and the adhesion layer 13 and the patterned photoresist (not shown) formed in a later step. The metal pad 11 may be a light weight material, such as Al, and patterned. However, other metal materials may be suitable as well.

The passivation layer 12 is disposed on the metal pad 11 and simultaneously has a pattern to define a recess 15 so the recess 15 is also disposed on the metal pad 11. The passivation layer 12 is an electric insulating material, such as silicon oxide, silicon nitride or the combination thereof. Generally speaking, the size of the recess 15 may be preferably smaller than the size of the metal pad 11.

The adhesion layer 13 is disposed in the recess 15. In addition, the adhesion layer 13 covers the metal pad 11 and the passivation layer 12 so the adhesion layer 13 may directly contact the metal pad 11 and the passivation layer 12. The adhesion layer 13 helps a later formed metal bump material (not shown) to firmly adhere to the recess 15. The adhesion layer 13 may be an alloy layer, such as TiW alloy layer or a Ti layer.

The adhesion layer 13 may be formed by sputtering (illustrated I the form of arrows) a layer of Ti/W alloy and a seed layer such as copper to uniformly cover the substrate 10, for example to entirely cover the surface of the metal pad 11, the passivation layer 12 and the recess 15. The result is shown in FIG. 1.

Figure 2:
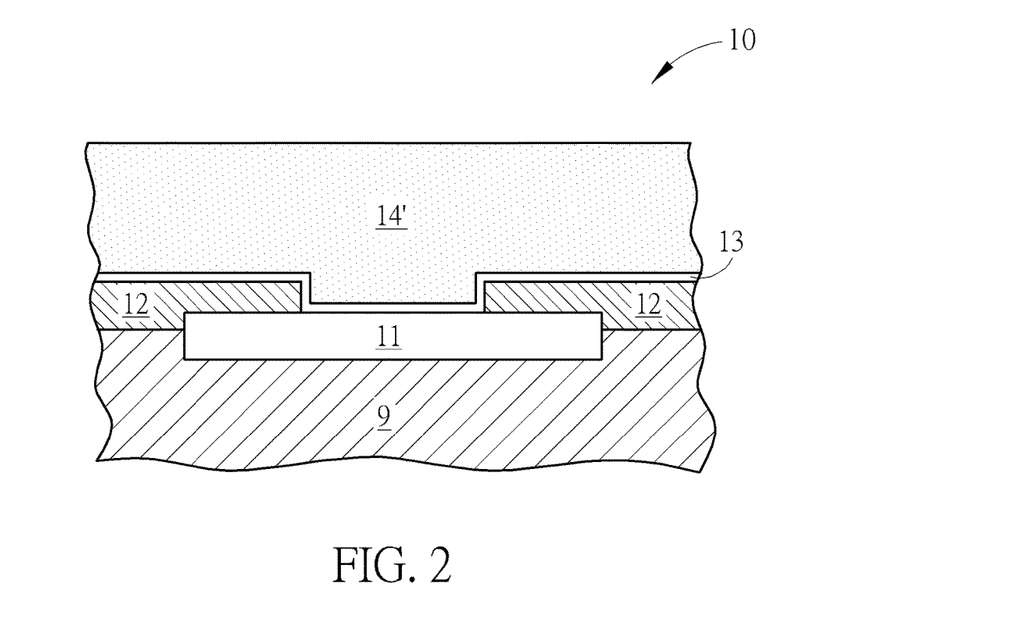

Next, as shown in FIG. 2, a bulk layer of photoresist 14' is formed on the adhesion layer 13 and to fill up the recess 15. The photoresist 14' may be a photosensitive material, such as an organic material.

Figure 3:
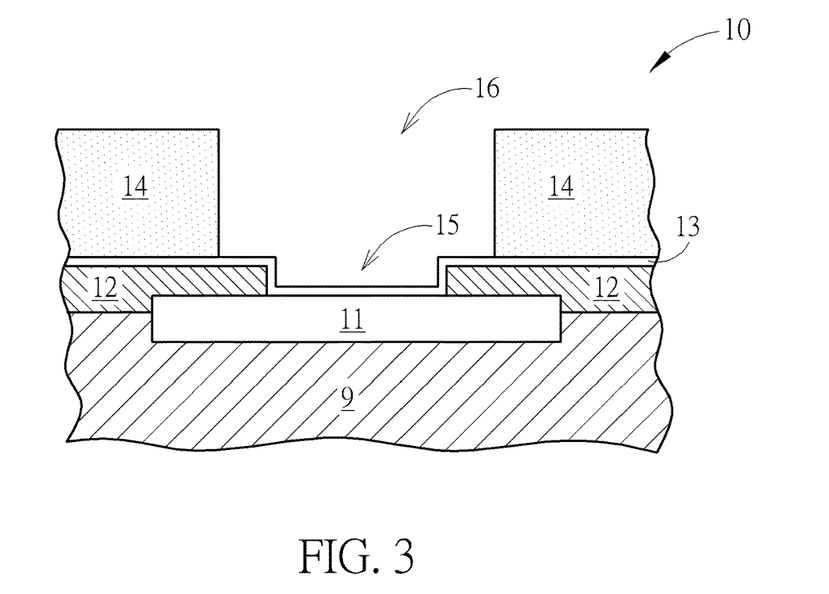

Afterwards, as shown in FIG. 3, the photoresist 14' is patterned, may be conventionally. The patterned photoresist 14 may be formed as follows. For example, the patterned photoresist 14 is formed on the adhesion layer 13 to define an opening 16.

The opening 16 is used to expose the adhesion layer 13 which is disposed in the recess 15 and on the passivation layer 12 so, in one embodiment of the present invention, the opening 16 is slightly larger than the recess 15. In other words, the opening 16 is used to define the space which the later formed metal bump material (not shown) is accommodated in. The space itself accommodates the recess 15, too.

Then, the bulk photoresist 14' undergoes a suitable exposure and development step to transform to a patterned photoresist 14 to have a pre-determined pattern which is formed by the suitable exposure and development steps. The pattern is defined by the opening 16 and the resultant structure is shown in FIG. 3.

Figure 4:
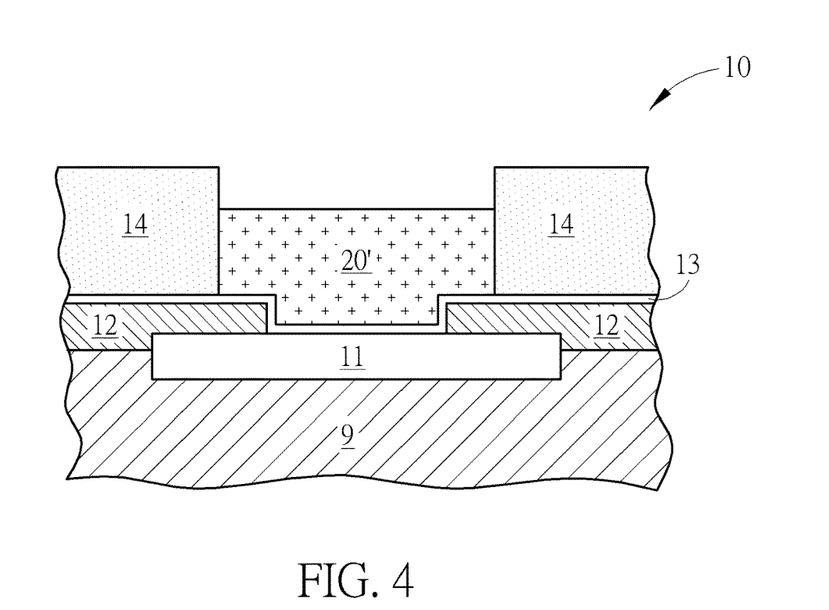
Figure 5:
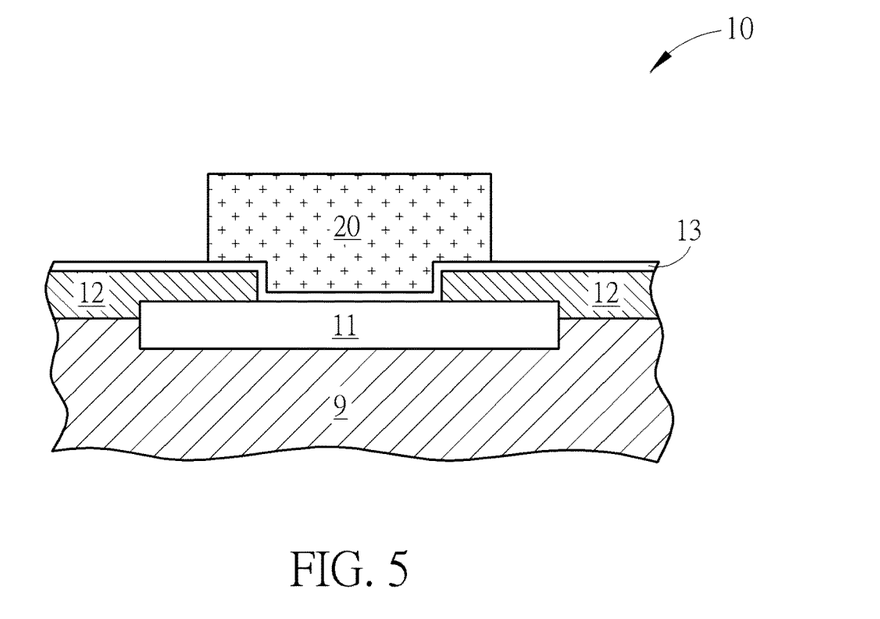

Second, as shown in FIG. 4, a metal bump material 20' is used to fill the opening 16. Please note that metal bump material 20' may merely "fill" the opening 16 but not "fill up" the opening 16. The adhesion layer 13 is sandwiched between the metal bump material 20' and the metal pad 11 or the passivation layer 12. For example, the metal bump material 20' is formed by plating because both the metal pad 11 and the adhesion layer 13 are electric conductive. Optionally, the metal bump material 20' may be palladium, silver, copper or gold to pursue an electric resistance and chemical activity as less as possible. Preferably, the metal bump material 20' consists of Cu.

Once the metal bump material 20' is well constructed, the service of the photoresist 14' is no longer required. Then, please refer to FIG. 5, the patterned photoresist 14 is removed so that the metal bump material 20' becomes an individual metal bump 20. The patterned photoresist 14 may be removed conventionally. The individual metal bump 20 is completely disposed on and in direct contact with the adhesion layer 13.

Figure 6:
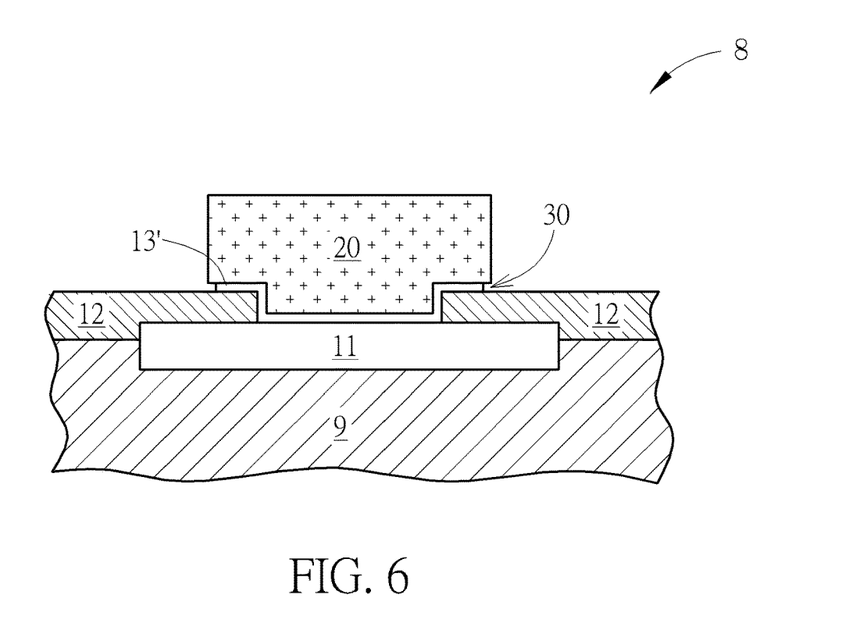

Because the adhesion layer 13 is electric conductive, it results in the individual metal bumps 20 shorting, so the excess adhesion layer 13 should be removed. Next, as shown in FIG. 6, the adhesion layer 13 which is not covered by the metal bump 20 is removed by an etching step to partially expose the underlying passivation layer 12 so that individual metal bumps 20 are electrically insulated from one another by the electrically insulating material, i.e. the passivation layer 12. In such a way, the metal bump 20 is self-aligned to the adhesion layer 13 and a matrix 8 is obtained. The etching step to remove the adhesion layer 13 may be different according to different materials. For example, to remove Ti layer, an HF based solution is used. To remove Cu layer, $H_2SO_4$ based solution is used. To remove TiW layer, hydrogen peroxide solution is used.

Later, after the etching step, an optional curing step may be carried out to adjust the hardness of the metal bump 20. For example, the curing step is a thermal step and the optional thermal curing step may be carried out under 250° C.-300° C. for about 30 min. to lower the hardness of the metal bump 20 to an ideal range. For instance, a lower hardness requires higher temperature and longer time; higher hardness requires lower temperature and shorter time. The metal bump 20 is cured to have an ideal hardness, such as not more than 130 Hv (Vickers harness), preferably not more than 110 Hv, more preferably between 110 Hv and 50 Hv.

Please pay attention to FIG. 6 that a notch 30 may be simultaneously formed among the metal bump 20, the adhesion layer 13 and the passivation layer 12 when the adhesion layer 13 is removed because the etching step not only completely remove the adhesion layer 13 which is not covered by the metal bump 20, the etching step but also further removes the adhesion layer 13 other than this which is not covered by the metal bump 20, for example the adhesion layer 13' sandwiched between the metal bump 20 and the passivation layer 12. The result is that a notch 30 is formed among the metal bump 20, the adhesion layer 13' and the passivation layer 12, which is one of the structural features of the present invention. In the presence of the notch 30, the metal bump 20 may possibly almost cover the adhesion layer 13'.

An optional wet-cleaning step may be carried out to clean the surface of the metal bump 20, preferably to remove an oxide on the metal bump layer 20 to facilitate the formation and adhesion of the following capping layer. After the optional wet-cleaning step, another optional step may be carried out to rinse the metal bump 20 when needed.

Before forming the capping layer, an optional activating step may be carried out to activate the surface of the metal bump 20 to facilitate the formation and adhesion of the capping layer. The activating step may be a wet step and may be carried out in the presence of a sulfate. After the optional activating step, another optional step may be carried out to rinse the surface of the activated metal bump 20.

Because the individual metal bumps 20 are still susceptible to an ambient atmosphere, a cover layer is intentionally formed to cover the metal bump 20 as much as possible so that the metal bump 20 is not exposed to an ambient atmosphere. Please refer to FIG. 7, a capping layer 40 is formed to completely cover the metal bump 20 and further extend into the recess 30, to obtain a desirable metal bump structure 1 due the presence of the notch 30. In other words, the capping layer 40 is self-aligned to the metal bump 20. In one embodiment of the present invention, the capping layer 40 is formed to completely cover the metal bump 20 without forming a collateral alloy layer in the absence of the notch 30, as shown in FIG. 7.

The optional capping layer 40 may include various protective conductive materials. In case of a Cu bump, the capping layer 40 may include at least one of Sn, Ni, Au and Pd. In case of an Au bump, the capping layer 40 may include at least one of Sn, Ni and Pd. In case of an Ag bump, the capping layer 40 may include Sn. In case of a Pd bump, the capping layer 40 may include Sn. However, the formation of the capping layer 40 may at least reduce the size of the notch 30 or would make the notch 30 vanish by filling it, as shown in FIG. 7.

Figure 7:
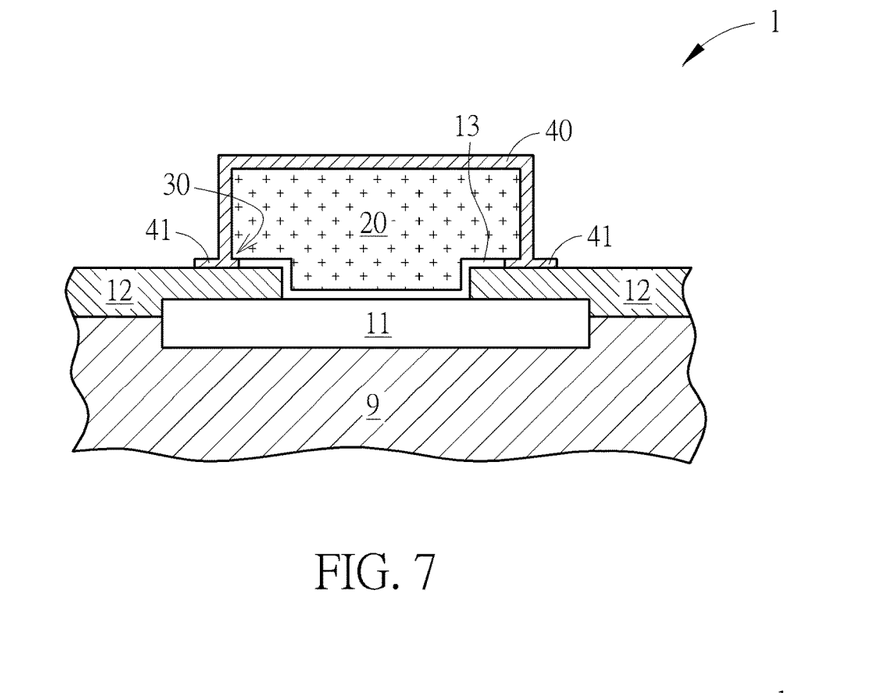
FIGS. 7, 8 and 9 illustrate different features of the metal bump structure of the present invention.

To be noticed, the formation of the optional capping layer 40 may also collaterally form an extending lateral capping fringe 41 disposed on the substrate 10, in direct contact with the passivation 12 in particular, as shown in FIG. 7. The lateral dimension of the capping fringe 41 may be larger than the thickness of the capping layer. For example, when the thickness of the capping layer is 0.3 μm, the lateral dimension of the capping fringe 41 may be 3 μm, which is about 10 times greater.

The capping layer 40 may be formed by an immersion plating step. The immersion plating step is carried out in a special condition to control the growing rate of the capping layer around 0.05 μm/min so that the resultant thickness of the capping layer is around 0.4 μm-0.05 μm. For example, the immersion plating step is a wet step, carried out in the presence of a sulfate under an approximately neutral condition and an elevated temperature. The approximately neutral condition may have a pH value around 6~8. The elevated temperature may be 40 to 85° C. The procedures for forming the capping layer 40 are listed in Table 1 for reference. Optionally, after each step in Table 1, a rinse step by pure water may be carried out. After the optional capping layer 40 is formed, another optional step may be carried out to rinse the capping layer 40 when needed.

TABLE 1

| Plating procedures | Temperature (° C.) | pH value | Time (second) |
|---|---|---|---|
| Bump cleaning step | Room temperature | Less than 7 | 30-60 |
| Acid treatment step | Room temperature | Less than 1 | 30-120 |
| Seed-activating step | Room temperature | 1.1-2 | 60-360 |
| Pd step | 50-54 | 6~8 | 600-1200 |
| Ni step | 50-54 | 6~8 | 600-1200 |
| Gold step | 85 | 4.7-5.3 | Less than 1200 |

Figure 7A:
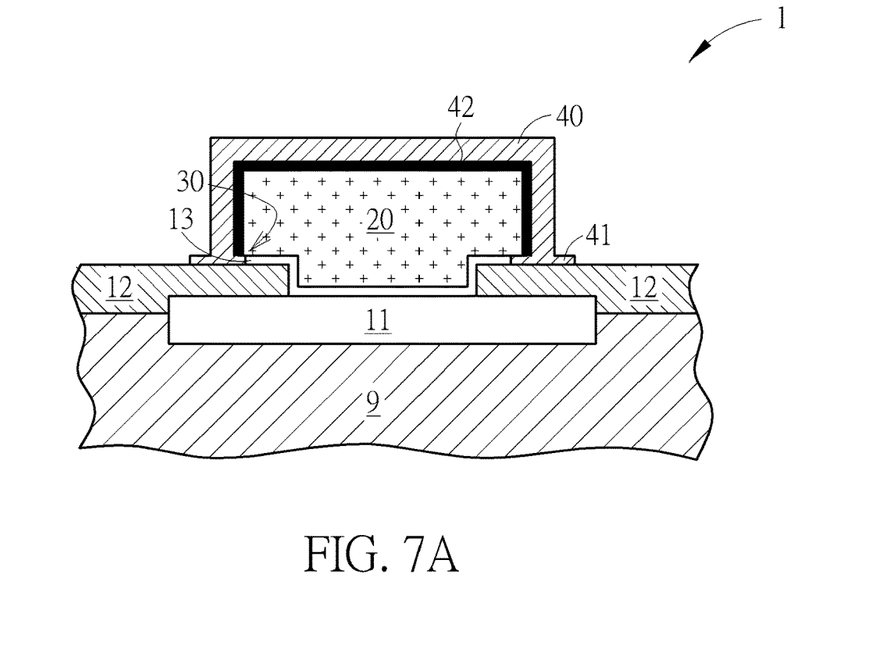
FIG. 7A illustrate the capping layer on the metal bump is cured.

In another embodiment of the present invention, another curing step may be optionally employed to form an alloy. For example, as shown in FIG. 7A, the capping layer 40 on the metal bump 20 is cured, for example around 150° C.~180° C. for 30~60 minutes, to form an alloy 42 with the metal bump 20. Generally speaking, copper and tin may form various alloy in different conditions, such as $Cu_3Sn$, $Cu_6Sn_5$, $Cu_{41}Sn_{11}$, or $Cu_{10}Sn_3$.

The alloy 42 is intentionally formed to keep the metal bump 20 from penetrating the capping layer 40 under extreme conditions. Under the protection of the capping layer 40 with or without the alloy 42, the metal bump 20 is free of a galvanic effect even in the presence of a high electric field and/or halogen.

In the present invention, the capping layer 40 can be directly disposed on the metal bump 20, for example a Pd layer on a Cu bump, without the help of other intervening materials, such as Ni. Because Ni is harder than Cu, once Ni is introduced to help a subsequent layer to be able to adhere to the metal bump structure 1, the resultant hardness of the metal bump structure 1 would be too great to be practical. For example, in the presence of Ni, the hardness would be greater than 130 HV, which is not ideal.

Figure 8:
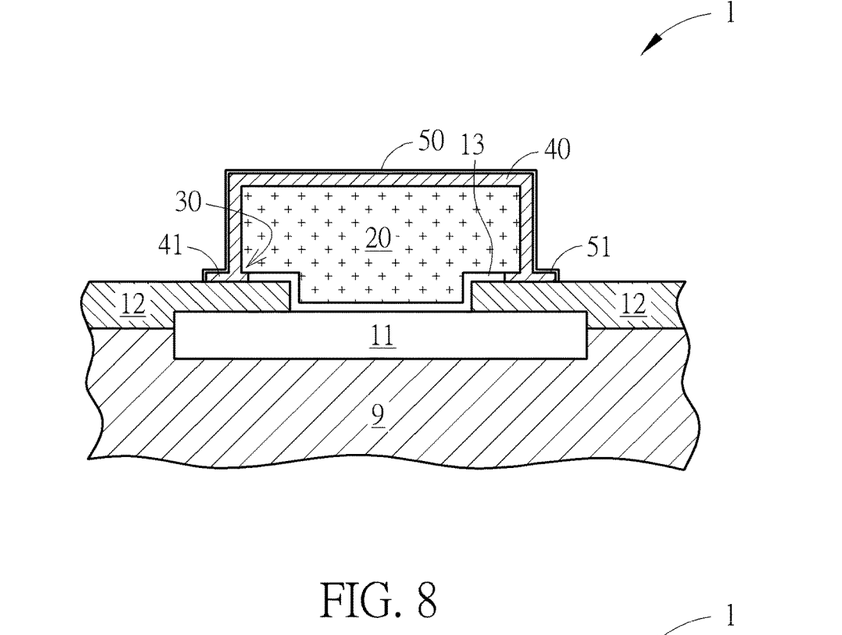

Further, as shown in FIG. 8, when the optional capping layer 40 is present, a protective layer 50 may be further formed to completely cover the capping layer 40 to obtain the desirable metal bump structure 1. The protective layer 50 is formed to be directly disposed on the capping layer 40 when the optional capping layer 40 is present. In case of a Cu bump, the protective layer 50 consists of a layer of Au as thin as possible. To be noticed, the formation of the protective layer 50 may also similarly collaterally forms an extending lateral protective fringe 51 disposed on the capping fringe 41, in direct contact with both capping layer 40 and the passivation layer 12 in particular, as shown in FIG. 8. The presence of the alloy 42 is independent of the presence of the protective layer 50.

Figure 9:
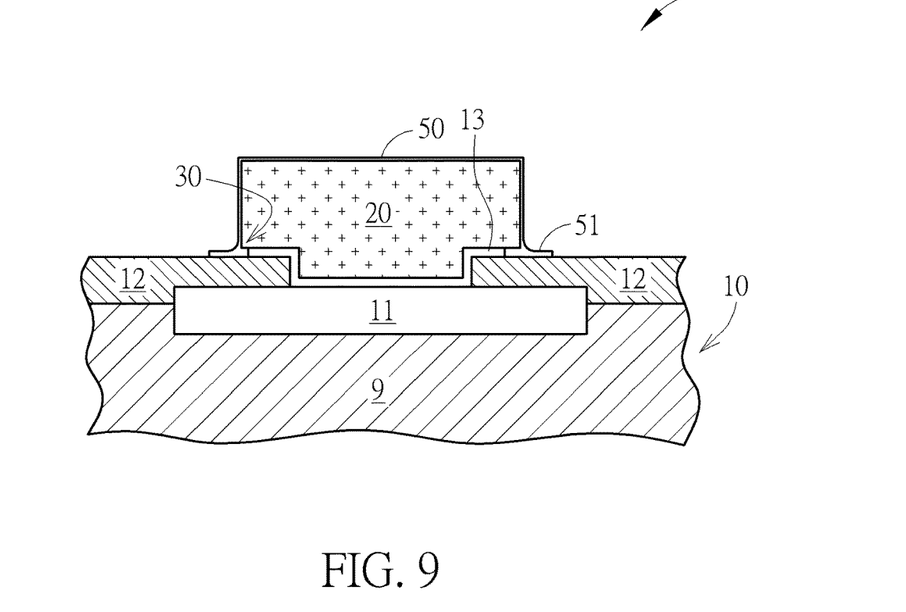

Alternatively, as shown in FIG. 9, when the optional capping layer 40 is absent, the protective layer 50 may be formed without the capping layer to completely and directly cover the metal bump 20 to obtain the desirable metal bump structure 1. In case of a Cu bump, the protective layer 50 consists of a layer of Au as thin as possible. To be noticed, the formation of the protective layer 50 may similarly collaterally forms an extending lateral fringe 51 disposed on the substrate 10, in direct contact with the passivation layer 12 in particular, as shown in FIG. 9. The protective layer 50 may also possibly form an alloy with the metal bump 20.

The protective layer 50 may be formed by an electroless plating step. The electroless plating step is carried out in a special condition in order to control the growing rate of the protective layer around 0.006 μm/min so that the resultant thickness of the protective layer 50 can be as thin as possible, for example 0.05-0.4 μm. For example, the electroless plating step is a wet step, carried out in conventional procedures. Since the resultant thickness of the protective layer 50 is as thin as possible, the consumption of a protective material, such as Au, may be greatly reduced to lower the production cost. Moreover, this copper bump structure 1 is easy to rework without damaging the reliability of the electronic circuits because the protective layer 50 is as thin as possible and easier to be removed when the copper bump structure 1 needs reworking.

The protective layer 50 is intentionally formed to completely cover the optional capping layer 40, the capping fringe 41 or merely the metal bump 20 to protect the metal bump 20 from an undesirable galvanic effect. Under the protection of the protective layer 50 with or without a collateral alloy, the metal bump 20 is free of a galvanic effect even in the presence of a high electric field and/or halogen.

The resultant metal bump structure 1 may be employed in a chip on glass (COG) package or in a chip on flex (COF) package. As a result, the present invention also provides a metal bump structure 1 for use in a driver IC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal bump structure for use in a driver IC, comprising:
   a metal pad;
   a passivation layer disposed on said metal pad and defining a recess disposed on said metal pad;
   an adhesion layer completely disposed in said recess, disposed on said metal pad and partially disposed on said passivation layer, wherein said adhesion layer is in direct contact with said metal pad and with said passivation layer;
   a metal bump filling said recess and covering said adhesion layer; and
   a cover layer completely covering said metal bump so that said metal bump is not exposed to an ambient atmosphere, wherein said cover layer extend into a defined recess defined by said metal bump, by said adhesion layer and by said passivation layer and has a fringe which extends in a lateral direction and is directly disposed on said passivation layer to partially expose said passivation layer.

2. The metal bump structure for use in a driver IC of claim 1, wherein a notch is disposed among said metal bump, said adhesion layer and said passivation layer.

3. The metal bump structure for use in a driver IC of claim 2, wherein said cover layer is at least one of a protective layer and a capping layer and said fringe is at least one of a protective fringe and a capping fringe which correspond to said protective layer and said capping layer.

4. The metal bump structure for use in a driver IC of claim 3, wherein said protective layer fills said notch to form a T-shaped cross section so that said protective fringe is in direct contact with said adhesion layer.

5. The metal bump structure for use in a driver IC of claim 3, wherein said protective layer consists of a layer of Au.

6. The metal bump structure for use in a driver IC of claim 3, wherein said capping layer fills said notch to form a T-shaped cross section so that said capping fringe is in direct contact with said adhesion layer.

7. The metal bump structure for use in a driver IC of claim 1, wherein said capping layer consists of a layer of Pd.

8. The metal bump structure for use in a driver IC of claim 6, wherein said capping layer is sandwiched between said protective layer and said metal bump so that said protective fringe covers said capping fringe.

9. The metal bump structure for use in a driver IC of claim 1, wherein said metal bump is self-aligned to said adhesion layer.

10. The metal bump structure for use in a driver IC of claim 1, wherein said metal bump comprises one of Cu and Au.

11. The metal bump structure for use in a driver IC of claim 1, wherein said cover layer is self-aligned to said metal bump.

12. The metal bump structure for use in a driver IC of claim 1 in one of a chip on glass (COG) package and a chip on flex (COF) package.

13. A method for forming a metal bump structure for use in a driver IC, comprising:
  providing a substrate comprising:
    a metal pad;
    a passivation layer disposed on said metal pad and defining a recess disposed on said metal pad;
    an adhesion layer disposed in said recess, covering and directly contacting said metal pad and said passivation layer; and
    a patterned photoresist disposed on said adhesion layer and comprising an opening exposing said adhesion layer disposed in said recess and on said passivation layer;
  filling said opening with a metal bump material;
  removing said patterned photoresist so that said metal bump material becomes a metal bump disposed on said adhesion layer;
  removing said adhesion layer which is not covered by said metal bump to partially expose underlying said passivation layer; and
  forming a cover layer to completely cover said metal bump and to extend into a defined recess defined by said metal bump, by said adhesion layer and by said passivation layer, wherein forming said cover layer collaterally forms a fringe which extends in a lateral direction and is directly disposed on said passivation layer to partially expose said passivation layer.

14. The method for forming a metal bump structure for use in a driver IC of claim 13, wherein said cover layer is formed to be self-aligned to said metal bump.

15. The method for forming a metal bump structure for use in a driver IC of claim 13, wherein said adhesion layer is over-removed to form a notch disposed among said metal bump, said adhesion layer and said passivation layer when removing said adhesion layer.

16. The method for forming a metal bump structure for use in a driver IC of claim 13, wherein said cover layer is at least one of a protective layer and a capping layer and said fringe is at least one of a protective fringe and a capping fringe which correspond to said protective layer and said capping layer.

17. The method for forming a metal bump structure for use in a driver IC of claim 16, wherein said protective layer fills said notch to form a T-shaped cross section so that said protective fringe is in direct contact with said adhesion layer.

18. The method for forming a metal bump structure for use in a driver IC of claim 16, wherein said protective layer consists of a layer of Au.

19. The method for forming a metal bump structure for use in a driver IC of claim 16, wherein said capping layer fills said notch to form a T-shaped cross section so that said capping fringe is in direct contact with said adhesion layer.

20. The method for forming a metal bump structure for use in a driver IC of claim 16, wherein said capping layer consists of a layer of Pd.

21. The method for forming a metal bump structure for use in a driver IC of claim 16, wherein said capping layer is sandwiched between said protective layer and said metal bump so that said protective fringe covers said capping fringe.

22. The method for forming a metal bump structure for use in a driver IC of claim 13, wherein said metal bump comprises one of Cu and Au.

23. The method for forming a metal bump structure for use in a driver IC of claim 13, wherein filling said opening with said metal bump material is performed by plating.

24. The method for forming a metal bump structure for use in a driver IC of claim 13, wherein forming said cover layer is performed by plating.

25. The method for forming a metal bump structure for use in a driver IC of claim 13, further comprising:
  curing said metal bump to adjust its hardness.

* * * * *